(12) United States Patent
Fan (10) Patent No.: US 11,229,856 B2
(45) Date of Patent: Jan. 25, 2022

(54) ETCHING SOLUTION RECYCLING SYSTEM AND METHOD FOR WAFER ETCHING APPARATUS

(71) Applicant: Taiwan Semiconductor Manufacturing Co., Ltd., Hsinchu (TW)

(72) Inventor: Che-Lun Fan, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 509 days.

(21) Appl. No.: 15/719,610

(22) Filed: Sep. 29, 2017

(65) Prior Publication Data

US 2019/0099694 A1    Apr. 4, 2019

(51) Int. Cl.
*B01D 9/00* (2006.01)
*H01L 21/67* (2006.01)
*B01D 21/00* (2006.01)
*B01D 21/30* (2006.01)

(52) U.S. Cl.
CPC .......... *B01D 9/0036* (2013.01); *B01D 9/005* (2013.01); *B01D 9/0063* (2013.01); *B01D 9/0077* (2013.01); *B01D 21/009* (2013.01); *H01L 21/67017* (2013.01); *H01L 21/67086* (2013.01);
(Continued)

(58) Field of Classification Search
CPC .... B01D 9/0036; B01D 9/005; B01D 9/0077; B01D 9/0063; B01D 9/009; B01D 2009/0086; B01D 2009/009; B01D 21/0012; B01D 21/0003; B01D 21/0024; B01D 21/009; B01D 21/02; B01D 21/2422; B01D 21/2488; B01D 21/305; B01D 21/00–34; B01D 9/00–0081; H01L 21/67017; H01L 21/67075; H01L 21/30604; H01L 21/31111; H01L 21/32134; H01L 21/67057; H01L 21/67023; H01L 21/67028; H01L 21/6704; H01L 21/67046; H01L 21/67051; H01L 21/67063; H01L 21/6708; H01L 21/67086; C09K 13/04; C01B 25/237; C23F 1/46; C02F 2103/346
See application file for complete search history.

(56) References Cited

U.S. PATENT DOCUMENTS

| 3,615,246 | A | * | 10/1971 | Lindstrom | ........... | B01D 9/0013 |
| | | | | | | 422/252 |
| 3,634,044 | A | * | 1/1972 | Parker | ...................... | C30B 7/00 |
| | | | | | | 117/70 |

(Continued)

*Primary Examiner* — Benjamin Kendall
*Assistant Examiner* — Kurt Sweely
(74) *Attorney, Agent, or Firm* — McClure, Qualey & Rodack, LLP (57) ABSTRACT

An etching solution recycling system for a wafer etching apparatus is provided. The etching solution recycling system includes a settling tank, a seed provider, and a fluid control unit. The settling tank is connected to an etching tank of the wafer etching apparatus and configured to receive an etching solution from the etching tank. The seed provider is configured to provide at least one seed crystal into the settling tank to reduce the silicate concentration in the etching solution in the settling tank. The fluid control unit is configured to deliver the etching solution in the settling tank back into the etching tank.

20 Claims, 7 Drawing Sheets

(52) U.S. Cl.
CPC ........ *B01D 21/0012* (2013.01); *B01D 21/305* (2013.01)

(56) References Cited

U.S. PATENT DOCUMENTS

| | | | | |
|---|---|---|---|---|
| 4,778,532 | A * | 10/1988 | McConnell | B05C 3/109 134/10 |
| 5,470,421 | A * | 11/1995 | Nakada | H01L 21/67075 210/750 |
| 5,722,441 | A * | 3/1998 | Teramoto | B08B 3/10 134/56 R |
| 6,207,068 | B1 * | 3/2001 | Glick | H01L 21/31111 156/345.18 |
| 7,964,108 | B2 * | 6/2011 | Izuta | C09K 13/04 210/806 |
| 9,230,836 | B2 * | 1/2016 | Higuchi | H01L 21/67051 |
| 2005/0263488 | A1 * | 12/2005 | Change | H01L 21/31111 216/83 |
| 2015/0380323 | A1 * | 12/2015 | Yang | H01L 21/67253 438/8 |

* cited by examiner

ETCHING SOLUTION RECYCLING SYSTEM AND METHOD FOR WAFER ETCHING APPARATUS

BACKGROUND

Silicon nitride is a dielectric material that is very frequently used in many applications in the manufacture of semiconductor devices. A layer of silicon nitride is typically formed over a semiconductor substrate upon which semiconductor devices are being fabricated. As the technology behind the semiconductor manufacturing process continues to advance, devices being designed and built on the surface area of a single wafer are significantly increasing and miniaturized, which results in a new set of processing challenges, such as being able to selectively etch silicon nitride with respect to the underlying silicon oxide layers.

One way to etch a silicon nitride layer is wet chemical etching. Wet chemical etching traditionally uses phosphoric acid ($H_3PO_4$) to remove or pattern the silicon nitride layer on the wafer in an etching tank. During the wet chemical etching of a silicon nitride layer, silicate forms and inhibits the subsequent etching of silicon oxide. The silicon oxide etching rate becomes dramatically lower as the silicate concentration in the etching solution (i.e. phosphoric acid) increases. As a result, the etching solution has an etching selectively with respect to silicon oxide and silicon nitride.

Although existing apparatuses and methods for the wet chemical etching of silicon nitride have been generally adequate for their intended purposes, they have not been entirely satisfactory in all respects.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Apparatuses for etching silicon nitride over a semiconductor substrate or substrates are provided in accordance with various exemplary embodiments. The variations of some embodiments are discussed. Throughout the various views and illustrative embodiments, like reference numbers are used to designate like elements.

Figure 1:
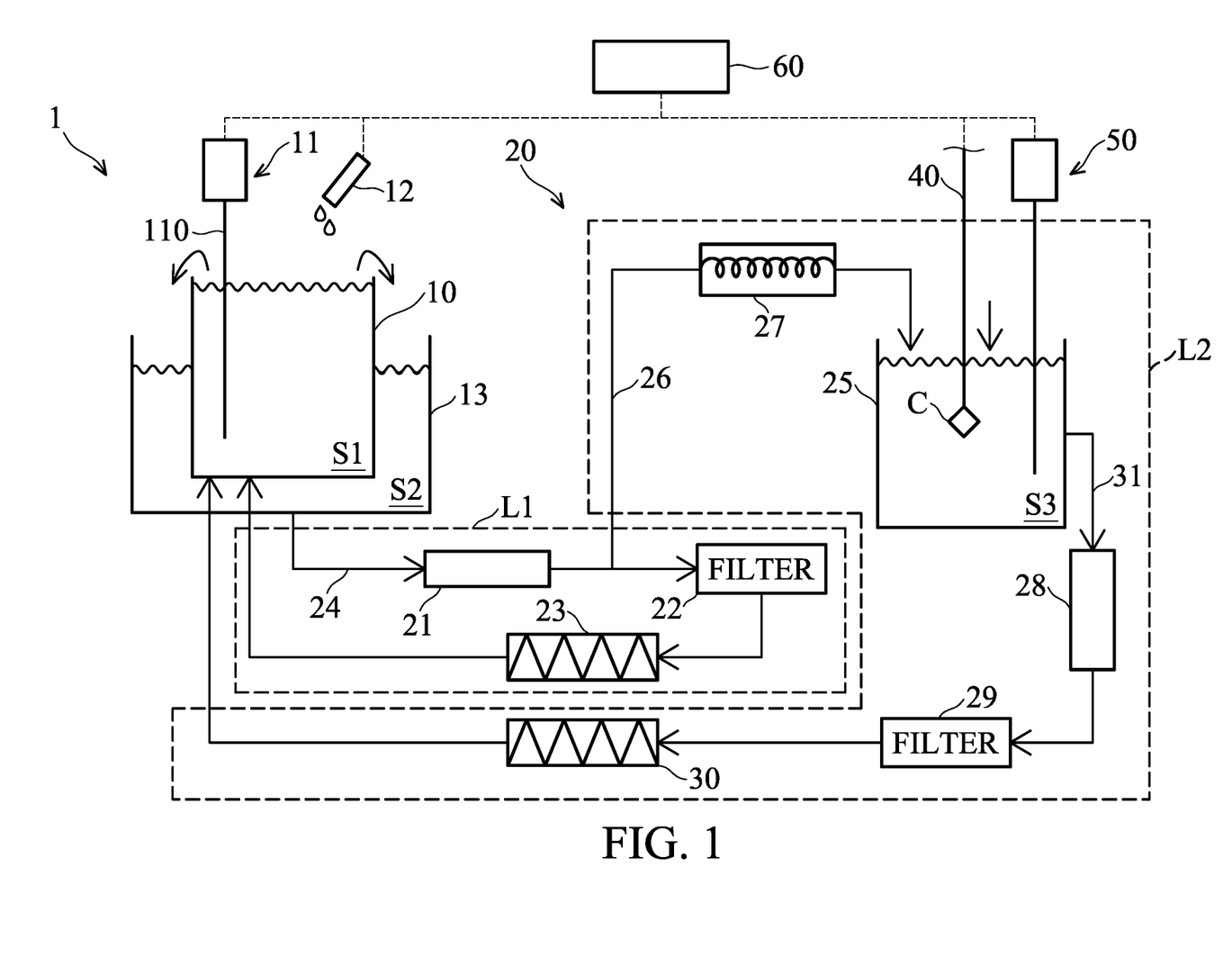
FIG. 1 is a schematic diagram of a wafer etching apparatus in accordance with some embodiments.

FIG. 1 is a schematic diagram of a wafer etching apparatus 1 in accordance with some embodiments. The wafer etching apparatus 1 includes an etching tank 10 that is used to contain an etching solution S1. In one exemplary embodiment, the etching solution S1 is hot phosphoric acid ($H_3PO_4$), which may be maintained at about 150° C. In other exemplary embodiments, the hot phosphoric acid may be maintained at a temperature within a range of about 70° C.-160° C. Various conventional heating members (not shown) may be used to heat the phosphoric acid in the etching tank 10. Semiconductor substrates (not shown), such as silicon wafers, are placed in the etching tank 10 for the etching of silicon nitride.

The basic chemical reaction that models the etching of silicon nitride with phosphoric acid is:

$$Si_3N_4 + 4H_3PO_4 + 10H_2O \rightarrow Si_3O_2(OH)_8 + 4NH_4H_2PO_4$$

Wherein the $Si_3O_2(OH)_8$ after dehydration may become:

$$Si_3O_2(OH)_8 \rightarrow 3SiO_2 + 4H_2O$$

The $NH_4H_2PO_4$ may form $NH_3 + H_3PO_4$, wherein the $NH_3$ may evaporate.

The chemical reaction shows that the silicon nitride etching process may be influenced by parameters of the process, including phosphoric acid and silicate concentration, temperature of the etching solution S1, and the life span of the etching solution S1. The silicon oxide etching rate becomes lower as the silicate concentration in the etching solution S1 increases, and therefore the etching solution S1 has an etching selectivity with respect to silicon oxide and silicon nitride. However, when the silicate reaching saturation solubility, the dehydration of $Si_3O_2(OH)_8$ occurs to form $SiO_2$ and water. The generation of silicon oxide precipitates results in a particle source which is the major yield killer in semiconductor processing.

A silicate concentration monitoring system 11 may be provided so as to measure the silicate concentration in the etching solution S1 in the etching tank 10. In accordance with one exemplary embodiment, the silicate concentration monitoring system 11 is a spectrophotometry real time monitor (RTM) system. The spectrophotometry RTM system 11 is connected to the etching tank 10 to monitor the silicate concentration in the etching solution S1 by extracting the exhaust at the top of the etching tank 10, the etching solution S1 at the bottom of the etching tank 10, or both. For example, the exhaust is a gas comprising $NH_3$.

Figure 2:
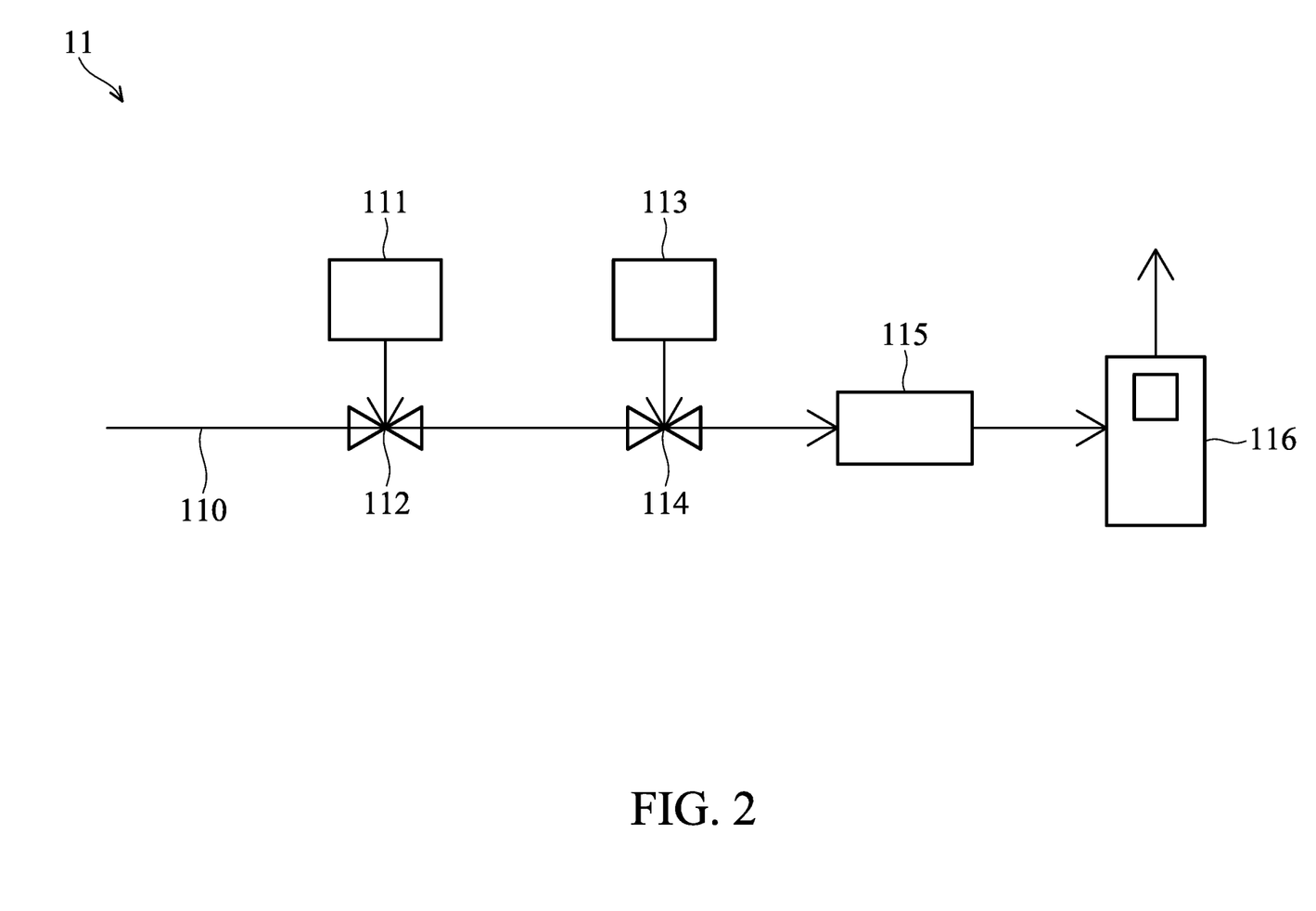
FIG. 2 is a schematic diagram of a spectrophotometry real time monitor (RTM) system for silicate concentration monitoring in accordance with some embodiments.

As shown in FIG. 1 and FIG. 2, the spectrophotometry RTM system 11 may include a detection line 110, a plurality of solution reservoirs 111, 113, a plurality of solution injection valves 112, 114, at least one mixing coil 115, and a spectrophotometer 116. The detection line 110 is connected to the bottom of the etching tank 10 to extract the etching solution S1 in the etching tank 10 for detecting the silicate concentration in the etching solution S1. The solution reservoirs 111, 113 are connected to the solution injection valves 112, 114 which are coupled to the detection line 110. The solution reservoirs 111, 113 may include solutions such as sodium hydroxide, molybdic acid, tartaric acid, ascorbic acid, and the like, which are used to help to detect the silicate concentration in the etching solution S1. The mixing coil 115 is installed in the detection line 110 and used to mix the solutions flowing from the solution reservoirs 111, 113 with the extracted etching solution S1 to form a mixed solution. The spectrophotometer 116 is installed in the detection line 110 and used to detect the color or the concentration of the mixed solution.

Accordingly, the spectrophotometry RTM system 11 monitors the silicate concentration in the etching solution S1 in the etching tank 10. In some embodiments, the spectrophotometry RTM system 11 samples and measures the silicate concentration in the etching solution S1 on a periodic, regular or essentially constant basis. It should be realized that the silicate concentration monitoring system 11 is not limited to the exemplary embodiment described above (i.e. a spectrophotometry RTM system). Other techniques, such as an atomic absorption spectroscopy or the like, may also be used to measure the silicate concentration in the etching solution S1 in the etching tank 10 in real time.

Furthermore, the silicate concentration monitoring system 11 may send the detected data to a control system 60, such as an advanced process control (APC) system including a computer. In accordance with one exemplary embodiment, the APC system is used to calculate the data from the silicate concentration monitoring system 11 and control a phosphoric acid provider 12 to supply fresh phosphoric acid to the etching tank 10 for controlling the silicate concentration in the etching solution S1.

For example, when the silicate concentration in the etching solution S1 is over a predetermined value, the APC system controls the phosphoric acid provider 12 to supply fresh phosphoric acid which contains no silicate to decrease the silicate concentration in the etching solution S1 in response to a result of the calculation. In accordance with some exemplary embodiments, the predetermined value may be etching selectivity with respect to silicon oxide: silicon nitride over 1:25. Thus, the etching selectivity with respect to silicon oxide: silicon nitride may be controlled in a range of about 1:15 to 1:25. When the etching selectivity is too high, the etching process may be hard to control. When the etching selectivity is too low, the silicon oxide may be etched together with the silicon nitride. The range of the etching selectively may be determined depending on different products or processes, and different volumes of fresh phosphoric acid may be needed to be added into the etching tank 10.

In the embodiments illustrated in FIG. 1, an overflow tank 13 may be provided outside the etching tank 10 to collect the etching solution overflowing from the etching tank 10 (the etching solution stored in the overflow tank 13 is labeled "S2"). The collected etching solution S2 in the overflow tank 13 may be used to maintain the etching solution S1 in the etching tank 10 at the desired temperature level. However, the overflow tank 13 may also be omitted in other exemplary embodiments.

The wafer etching apparatus 1 further includes an etching solution recycle system 20 which may be connected to the overflow tank 13 or connected to the etching tank 10 directly. The etching solution recycling system 20 is used to recirculate the etching solution S1 in response to the above calculation result from the APC system to remove the silicate in the recirculating etching solution, and recirculates the recirculating etching solution back into the etching tank 10, thereby decreasing the silicate concentration in the etching solution S1. As a result, the etching solution recycling system 20 helps to reduce the volume of the fresh phosphoric acid (provided by the phosphoric acid provider 12) required for maintaining the silicate concentration in the etching solution S1 in the etching tank 10.

In accordance with one exemplary embodiment, the etching solution recycling system 20 includes a recirculation loop L1 (also referred to as a "first recirculation loop L1") including a fluid control unit 21, a filter 22, and a heater 23 (see FIG. 1). It should be realized that additional elements/features may be added into the recirculation loop L1, and some of the elements/features described below may be replaced or eliminated in other embodiments.

The fluid control unit 21 is connected to the overflow tank 13 or the etching tank 10. The fluid control unit 21 is used to control the etching solution S1 or S2 for starting to recirculate and flow into a recirculating line 24 and to control the flow rate of the recirculating etching solution in the recirculating line 24. In accordance with some exemplary embodiments, the fluid control unit 21 comprises a pump, a controlling valve, a flow meter, and the like. The filter 22 is installed in the recirculating line 24 to filter the silicate precipitate in the recirculating etching solution and to make sure the recirculating etching solution has no silicate left. In accordance with some exemplary embodiments, the filter 22 comprises a membrane filter having a great filtering capacity for the silicate precipitate. The heater 23 is installed in the recirculating line 24 and connected to the filter 22 and the etching tank 10. The heater 23 is used to heat the recirculating etching solution to the same temperature as that of the etching solution S1 in the etching tank 10. The heater 23 may comprise various conventional heating members that can heat the recirculating etching solution in the recirculating line 24.

With the above arrangement, a clean, recirculating etching solution generated by the first recirculation loop L1 may decrease the silicate concentration in the etching solution S1 in the etching tank 10. Also, the volume of the fresh phosphoric acid provided by the phosphoric acid provider 12 can be reduced accordingly.

However, the filtering capability of the membrane filter 22 becomes lower as silicate precipitate gradually accumulates on the membrane filter 22. Therefore, the membrane filter 22 needs to be changed frequently.

In the embodiments illustrated in FIG. 1, the etching solution recycling system 20 further includes another recirculation loop L2 (also referred to as a "second recirculation loop L2"), which may help to recirculate the etching solution S1 and remove the silicate in the recirculating etching solution, so that the life of membrane filter 22 of the first recirculation loop L1 can be prolonged. It should also be realized that additional elements/features may be added into the recirculation loop L2, and some of the elements/features described below may be replaced or eliminated in other embodiments.

The recirculation loop L2 includes a settling tank 25 which is connected to the recirculation loop L1 through a connection line 26, so that a portion of the recirculating etching solution in the recirculation loop L1 may flow into the settling tank 25 (in other words, the volume of recirculating etching solution passing through the membrane filter 22 is reduced). However, the settling tank 25, in other exemplary embodiments, may also be directly connected to the etching tank 10 (or the overflow tank 13) through the connection line 26, to receive the recirculating etching solution from the etching tank 10 (the etching solution stored in the settling tank 25 is labeled "S3"). The volume of the settling tank 25 may be less than, equal to, or greater than that of the etching tank 10.

A cooler 27 may be installed in the connection line 26, in the embodiments as illustrated in FIG. 1. The cooler 27 is used to cool the recirculating etching solution in the connection line 26 to help to precipitate silicate in the settling tank 25. In accordance with an exemplary embodiment, the temperature of the recirculating etching solution may decrease about 5-10° C. after the recirculating etching solution passes through the cooler 27. In accordance with other exemplary embodiments, the temperature of the recirculating etching solution may become close to room temperature (e.g. 25° C.) after it passes through the cooler 27. The cooler 27 may comprise various conventional cooling members that can cool the recirculating etching solution delivered through the connection line 26 into the settling tank 25. However, the cooler 27 may also be omitted in other exemplary embodiments.

The etching solution recycling system 20 further includes a seed provider 40. The seed provider 40 is used to provide a seed crystal C into the settling tank 25 to reduce the silicate concentration in the etching solution S3 in the settling tank 25. For example, the seed crystal C may be a mono-crystalline silicon seed, and the seed provider 40 is a rope connected to the seed crystal C (see FIG. 1). When the seed provider 40 is lowered, the seed crystal C is placed into the settling tank 25 and immersed into the etching solution S3. With the effect of seed crystal, the seed crystal C gathers the silicates in the etching solution S3 to form a larger crystal. As the silicates in the etching solution S3 gradually adhere to the seed crystal C, the silicate concentration in the etching solution S3 becomes lower and lower.

A silicate concentration monitoring system 50 may also be provided so as to monitor the silicate concentration in the etching solution S3 in the settling tank 25 (see FIG. 1). The silicate concentration monitoring system 50 may use the same type of monitoring system as the silicate concentration monitoring system 11 described above, and thus is not repeated here. The silicate concentration monitoring system 50 may also be connected to the APC system (i.e., the control system 60). The APC system calculates the detected data from the silicate concentration monitoring system 50 and controls the operation of the seed provider 40.

Figure 3:
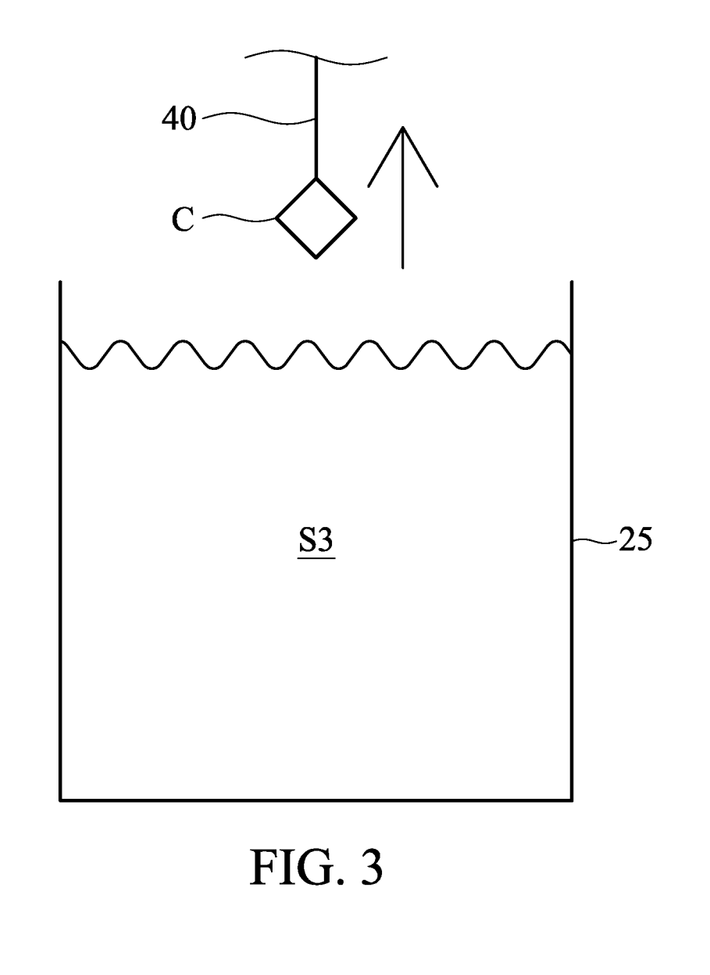
FIG. 3 schematically illustrates that a seed crystal is pulled out of the settling tank by a seed provider in accordance with some embodiments.

For example, when the silicate concentration in the etching solution S3 is reduced to a predetermined value, the APC system controls the seed provider 40 to move upwardly to pull the seed crystal C out of the settling tank 25 (see FIG. 3). In accordance with some embodiments, the predetermined value may be close to the silicate concentration of the fresh phosphoric acid.

Accordingly, the seed crystal C provides a similar function as the filter 22 of the recirculation loop L1 for removing the silicates in the recirculating etching solution. Moreover, the filtering capability of the seed crystal C is more stable as the silicates in the etching solution S3 gradually gather to the seed crystal C, compared to the membrane filter 22. In addition, the seed crystal C can be easily removed from the settling tank 25 (by the seed provider 40) for further processing such as removing impurities adhering thereto, and therefore the operation of the second recirculation loop L2 or the etching solution recycling system 20 do not need to be stopped for the removal of the seed crystal C in the settling tank 25.

Figure 4:
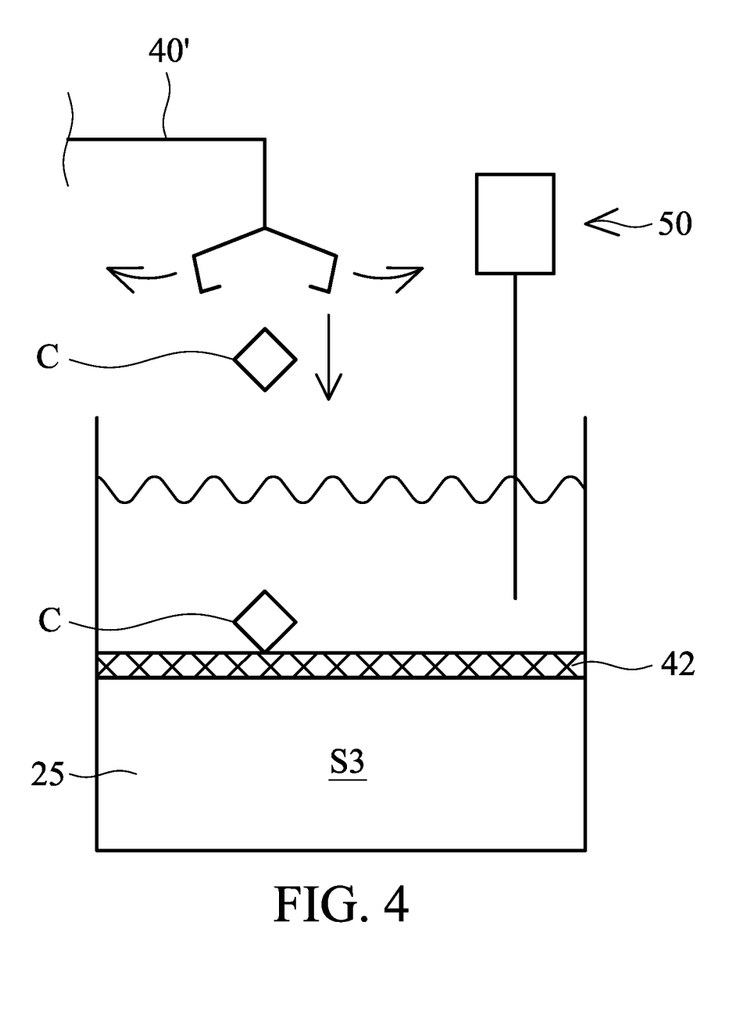
FIG. 4 is a schematic diagram of a part of the second recirculation loop and a seed provider in accordance with some embodiments.

It should be appreciated that many variations and modifications can be made to embodiments of the disclosure. FIG. 4 is a schematic diagram of a part of the second recirculation loop L2 and a seed provider 40' in accordance with some other embodiments. As shown in FIG. 4, the seed provider 40' is a movable robotic arm that has a clamping mechanism on one end. The seed provider 40' may grip and release the seed crystal C described above. In accordance with one exemplary embodiment, the seed provider 40' provides seed crystals C several times into the settling tank 25 to increase the rate of decrease in silicate concentration in the etching solution S3. For example, when the silicate concentration in the etching solution S3 drops too slowly, the APC system controls the seed provider 40' to continue to provide seed crystals C several times into the settling tank 25 to increase the rate of decrease in silicate concentration in the etching solution S3. When the silicate concentration drops fast enough, the APC system controls the seed provider 40' to stop providing seed crystal C into the settling tank 25.

In the embodiments of FIG. 4, a filter 42 may be provided in an appropriate position in the settling tank 25 so as to collect the seed crystals C. In accordance with one exemplary embodiment, the filter 42 comprises a metal-mesh filter having a maximum pore size that is less than the size of the seed crystals C, so that the seed crystals C may be retained on the filter 42 and will not settle to the bottom of the settling tank 25. When the silicate concentration in the etching solution S3 is reduced to a predetermined value as described above, the APC system controls the seed provider 40' or another mechanism (not shown) to remove the filter 42 and the seed crystals C thereon from the settling tank 25. Accordingly, the operation of the second recirculation loop L2 or the etching solution recycling system 20 do not need to be stopped for the removal of the seed crystals C in the settling tank 25.

Figure 5:
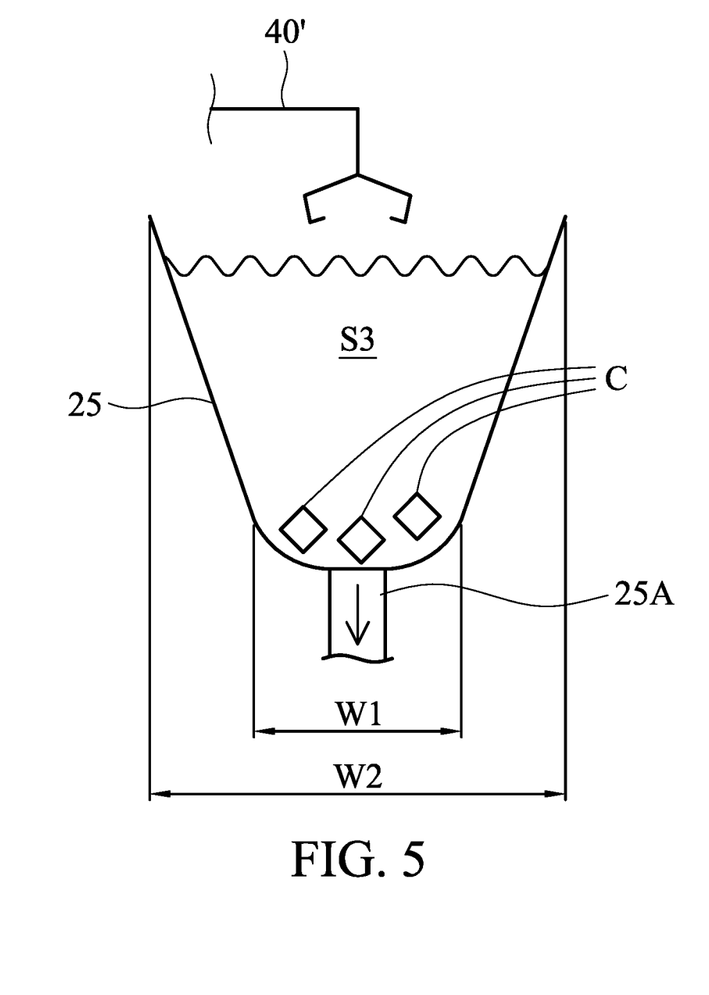
FIG. 5 is a schematic diagram of a part of the second recirculation loop and a seed provider in accordance with some embodiments.

FIG. 5 is a schematic diagram of a part of the second recirculation loop L2 and a seed provider 40' in accordance with some other embodiments. As shown in FIG. 5, the seed provider 40' is the same as that in the embodiments of FIG. 4, and the filter 42 (FIG. 4) is omitted. The seed crystals C may precipitate by gravity to the bottom of the settling tank 25. The settling tank 25 is designed to have an inclined sidewall, so that the width W1 of the bottom of the settling tank 25 is less than the width W2 of the top of the settling tank 25. Moreover, an outlet 25A, through which the seed crystals C are drained, is located at the bottom of the settling tank 25. Accordingly, when the seed crystals C are drained out of the settling tank 25 (after the silicate concentration in the etching solution S3 is reduced to a predetermined value as described above), a small amount of etching solution S3 is drained, while the most of etching solution S3 remain in the settling tank 25.

Figure 6:
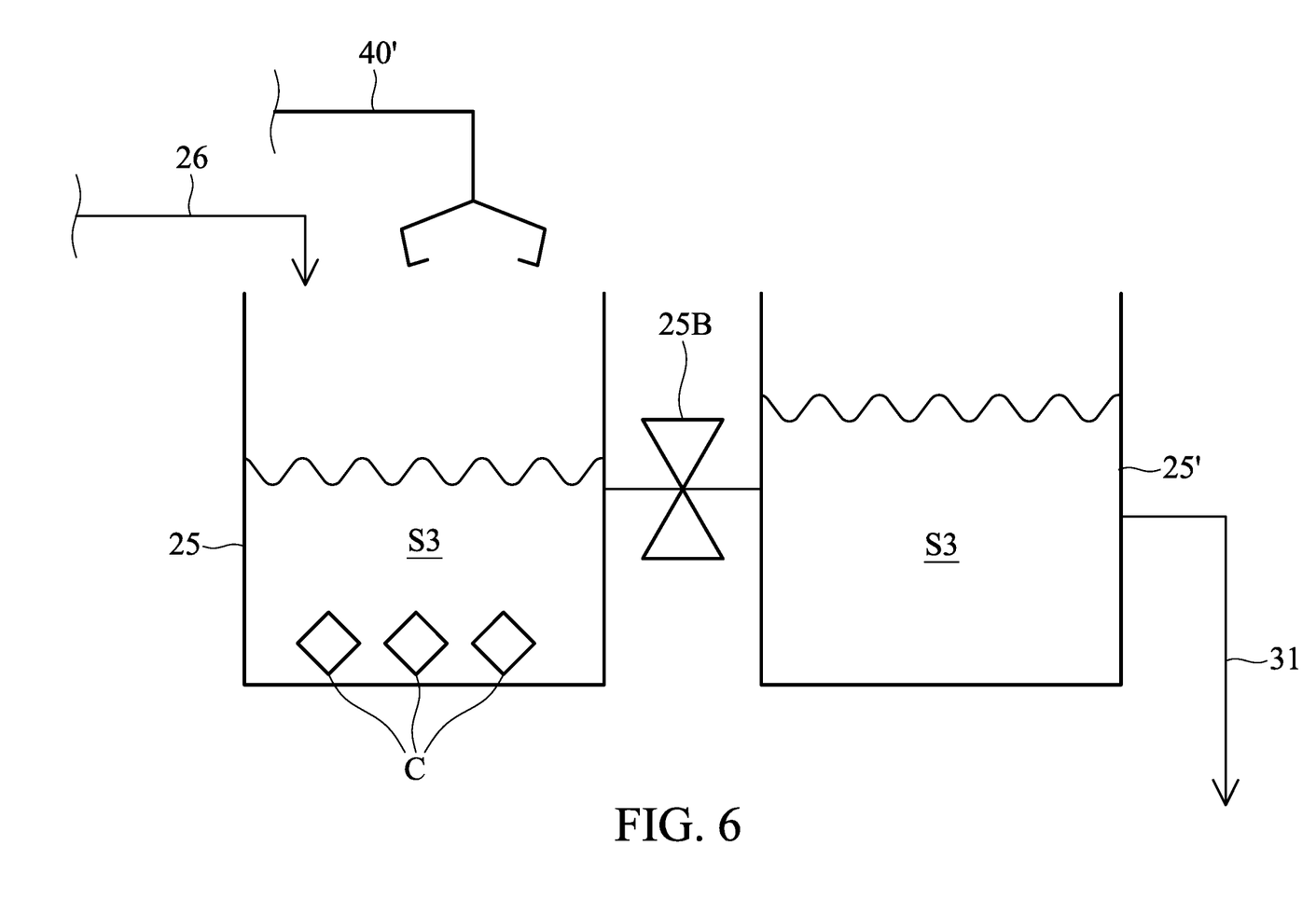
FIG. 6 is a schematic diagram of a part of the second recirculation loop and a seed provider in accordance with some embodiments.

FIG. 6 is a schematic diagram of a part of the second recirculation loop L2 and a seed provider 40' in accordance with some other embodiments. As shown in FIG. 6, two settling tanks 25, 25' are provided in the second recirculation loop L2. The recirculating etching solution from the etching tank 10 (FIG. 1) is delivered into the settling tank 25 through the connection line 26. The settling tank 25' is connected through a connection line 31 (which will be further described later) to the etching tank 10 for delivering a clean, recirculating etching solution back to the etching tank 10. The communication between the settling tanks 25, 25' is controlled by a valve 25B, such as a pneumatic valve or the like.

During operation, a seed provider 40' (the same as that in FIGS. 4 and 5) provides one or more seed crystals C to reduce the silicate concentration in the etching solution S3 in the settling tank 25. When the silicate concentration in the etching solution S3 is reduced to a predetermined value as described above, the APC system controls the valve 25B to allow the etching solution S3 in the settling tank 25 to flow into the settling tank 25'. Since the seed crystals C precipitate by gravity to the bottom of the settling tank 25, the etching solution S3 in the settling tank 25' contains no seed crystals C and has the desired silicate concentration for refreshing the etching solution S1 in the etching tank 10.

Although not shown in FIG. 6, the seed crystals C in the settling tank 25 may be removed by the removable filter 42 (FIG. 4) or drained out by the outlet 25A (FIG. 5) located at the bottom of the settling tank 25. In an alternative exemplary embodiment, the seed provider 40' may also provide seed crystals C into both settling tanks 25, 25' to reduce the silicate concentration in the etching solution S3. The quantities of the seed crystals C in the settling tanks 25, 25' may be the same or different.

Back to FIG. 1, the second recirculation loop L2 further includes a fluid control unit 28, a filter 29, and a heater 30. The fluid control unit 28 is connected to the settling tank 25 (or the settling tank 25' in FIG. 6). The fluid control unit 28 is used to control the etching solution S3 for starting to recirculate and flowing into the etching tank 10 through a connection line 31 between the settling tank 25 and the etching tank 10, and to control the flow rate of the recirculating etching solution in the connection line 31. In accordance with some exemplary embodiments, the fluid control unit 28 comprises a pump, a controlling valve, a flow meter, and the like. The filter 29 is installed in the connection line 31 to filter the recirculating etching solution therein. In accordance with one exemplary embodiment, the filter 29 is a membrane filter the same as the filter 22 described above, and is used to further filter the silicate precipitate in the recirculating etching solution and make sure that the recirculating etching solution has no silicate left. However, other types of filter which can filter particles, impurities and/or silicate precipitate in the recirculating etching solution may also be used. The heater 30 is used to heat the recirculating etching solution to the same temperature as that of the etching solution S1 in the etching tank 10. The heater 30 may comprise various conventional heating members that can heat the recirculating etching solution in the connection line 31.

With the above arrangement, a clean, recirculating etching solution generated by the second recirculation loop L2 may decrease the silicate concentration in the etching solution S1 in the etching tank 10. Also, the volume of the fresh phosphoric acid provided by the phosphoric acid provider 12 can be reduced accordingly. Furthermore, if the recirculation loops L1 and L2 are connected together, the second recirculation loop L2 prolongs the life of the filter 22 in the first recirculation loop L1, thereby improving the throughput of etching solution recycling system 20 while the cost is reduced.

Figure 7:
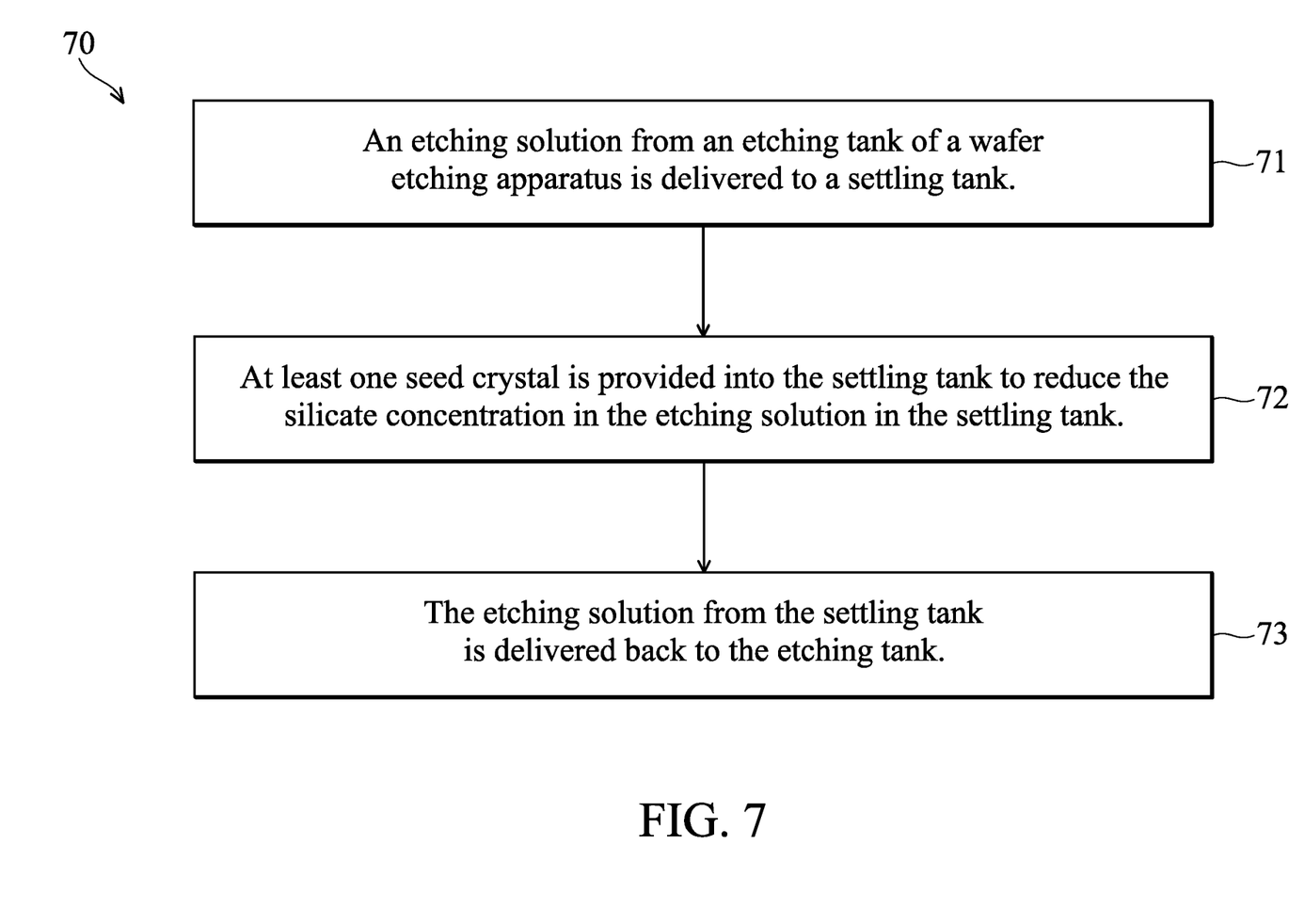
FIG. 7 is a simplified flow chart of an etching solution recycling method for a wafer etching apparatus in accordance with some embodiments.

FIG. 7 is a simplified flow chart of an etching solution recycling method 70 for a wafer etching apparatus in accordance with some embodiments. For illustration, the flow chart will be described along with the drawings shown in FIG. 1 to FIG. 6. Some of the described stages may be replaced or eliminated in different embodiments. Alternatively, some stages or operations may be added in different embodiments.

The method 70 includes operation 71, in which an etching solution from an etching tank of a wafer etching apparatus is delivered to a settling tank. In some embodiments as shown in FIG. 1, when the silicate concentration in the etching solution S1 in the etching tank 10 of the wafer etching apparatus 1 is over a predetermined value (i.e. the etching solution S1 is unsuitable to be used to etch silicon nitride over wafers), the etching solution S1 is delivered into a settling tank 25 of an etching solution recycling system 20 that is connected to the etching tank 10.

In some exemplary embodiments as shown in FIG. 1, before being delivered into the settling tank 25, the etching solution from the etching tank 10 is cooled by a cooler 27 of the etching solution recycling system 20, so as to help to precipitate silicate in the settling tank 25.

The method 70 further includes operation 72, in which at least one seed crystal is provided into the settling tank to reduce the silicate concentration in the etching solution in the settling tank. In some embodiments as shown in FIGS. 1 and 4-6, after the etching solution from the etching tank 10 flows into the settling tank 25 (labeled "S3"), one or more seed crystals C are provided by, for example, the seed provider 40 or seed provider 40', into the settling tank 25 to reduce the silicate concentration in the etching solution S3 in the settling tank 25 by the effect of seed crystal. More specifically, the seed crystals C may gather the silicates in the etching solution S3 to hasten silicate precipitate and crystallization.

In some exemplary embodiments as shown in FIGS. 1 and 2, the silicate concentration in the etching solution S3 in the settling tank 25 is monitored in real time by, for example, a spectrophotometry RTM system 50. In some exemplary embodiments as shown in FIGS. 3 to 6, after the silicate concentration in the etching solution S3 is reduced to a predetermined value (for example, close to the silicate concentration of fresh phosphoric acid), the seed crystal or crystals C are removed from the settling tank 25 by, for example, a seed provider 40, a seed provider 40' and a removable filter 42, or draining through an outlet 25A at the bottom of the settling tank 25.

The method 70 also includes operation 73, in which the etching solution from the settling tank is delivered back to the etching tank. In some embodiments as shown in FIGS. 1 and 3, after the silicate concentration in the etching solution S3 is reduced to the predetermined value and the seed crystal C is removed from the settling tank 25, the clean recirculating etching solution S3 is delivered back into the etching tank 10 to decrease the silicate concentration in the etching solution S1 in the etching tank 10. In other exemplary embodiments, the clean recirculating etching solution S3 may also be delivered back into the overflow tank 13 to help to maintain the etching solution S1 in the etching tank 10 at the desired temperature level.

The embodiments of the present disclosure have some advantageous features: Silicate in the settling tank of the etching solution recycling system can be quickly and effectively removed by providing mono-crystalline silicon seed(s) into the settling tank of the etching solution recycling system (with or without the recirculation effect provided by other recirculation loops). As a result, the recycle and reuse ratio of etching solution in the etching tank is increased, and the volume of fresh phosphoric acid required for maintaining the silicate concentration in the etching solution in the etching tank is reduced accordingly.

In some embodiments, an etching solution recycling system for a wafer etching apparatus is provided. The etching solution recycling system includes a settling tank, a seed provider, and a fluid control unit. The settling tank is connected to an etching tank of the wafer etchinq apparatus and configured to receive an etchinq solution from the etching tank. The seed provider is configured to provide at least one seed crystal into the settling tank to reduce the silicate concentration in the etchinq solution in the settling tank. The fluid control unit is configured to deliver the etchinq solution in the settling tank back into the etching tank.

In some embodiments, a wafer etching apparatus is provided. The wafer etching apparatus includes an etching tank, a settling tank, a seed provider, and a fluid control unit. The etching tank is configured to contain an etching solution. The settling tank is configured to receive the etching solution from the etching tank. The seed provider is configured to provide at least one seed crystal into the settling tank to reduce the silicate concentration in the etching solution in the settling tank. The fluid control unit is configured to deliver the etching solution in the settling tank back into the etching tank.

In some embodiments, an etching solution recycling method for a wafer etching apparatus is provided. The etching solution recycling method includes delivering an etching solution from an etching tank of the wafer etching apparatus to a settling tank. The etching solution recycling method further includes providing at least one seed crystal into the settling tank to reduce the silicate concentration in the etching solution in the settling tank. In addition, the etching solution recycling method includes delivering the etching solution in the settling tank back into the settling tank.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An etching solution recycling system for a wafer etching apparatus, comprising:
    an advanced process control (APC) system;
    a settling tank connected to an etching tank of the wafer etching apparatus and configured to receive an etching solution from the etching tank;
    a silicate concentration monitoring system coupled to the settling tank and the APC system, configured to detect a silicate concentration in the etching solution in the settling tank and send a detected data related to the silicate concentration to the APC system;
    a seed provider configured to provide at least one seed crystal into the settling tank to reduce the silicate concentration in the etching solution in the settling tank and to remove the at least one seed crystal from the settling tank, wherein the seed provider includes a rope connected to the at least one seed crystal, and wherein the APC system is configured to control the rope to move downwardly to place the at least one seed crystal into the settling tank and to control the rope to move upwardly to pull one of the at least one seed crystal out of the settling tank in response to the detected data from the silicate concentration monitoring system; and
    a fluid control unit configured to deliver the etching solution in the settling tank back into the etching tank.

2. The etching solution recycling system as claimed in claim 1, further comprising a cooler configured to cool the etching solution that is delivered to the settling tank from the etching tank.

3. The etching solution recycling system as claimed in claim 1, further comprising a heater configured to heat the etching solution that is delivered to the etching tank from the settling tank.

4. The etching solution recycling system as claimed in claim 1, wherein the seed provider provides seed crystals several times to increase a rate of decrease in silicate concentration in the etching solution in the settling tank.

5. The etching solution recycling system as claimed in claim 1, further comprising a filter removably provided in the settling tank for collecting the at least one seed crystal.

6. The etching solution recycling system as claimed in claim 1, further comprising a filter connected to the etching tank and the settling tank and configured to filter the etching solution that is delivered to the etching tank from the settling tank.

7. The etching solution recycling system as claimed in claim 1, further comprising a plurality of settling tanks, and the seed provider is configured to provide the at least one seed crystal into at least one of the settling tanks.

8. The etching solution recycling system as claimed in claim 1, further comprising a plurality of recirculation loops, and the settling tank and the fluid control unit are provided in at least one of the recirculation loops.

9. The etching solution recycling system as claimed in claim 1, further comprising:
    a first recirculation loop comprising a first filter and a first heater, wherein the first filter is connected to the etching tank, and the first heater is connected to the first filter and the etching tank; and a second recirculation loop comprising the settling tank, a second filter, and a second heater, wherein the second filter is connected to the settling tank, and the second heater is connected to the second filter and the etching tank.

10. The etching solution recycling system as claimed in claim 1, wherein the etching solution comprises phosphoric acid.

11. A wafer etching apparatus, comprising:
an advanced process control (APC) system;
an etching tank configured to contain an etching solution;
a settling tank configured to receive the etching solution from the etching tank;
a silicate concentration monitoring system coupled to the settling tank and the APC system, configured to detect a silicate concentration in the etching solution in the settling tank and send a detected data related to the silicate concentration to the APC system;
a seed provider configured to provide at least one seed crystal into the settling tank to reduce the silicate concentration in the etching solution in the settling tank and to remove the at least one seed crystal from the settling tank, wherein the seed provider includes a rope connected to the at least one seed crystal, and wherein the APC system is configured to control the rope to move downwardly to place the at least one seed crystal into the settling tank and to control the rope to move upwardly to pull one of the at least one seed crystal out of the settling tank in response to the detected data from the silicate concentration monitoring system; and
a fluid control unit configured to deliver the etching solution in the settling tank back into the etching tank.

12. The wafer etching apparatus as claimed in claim 11, further comprising a cooler configured to cool the etching solution that is delivered to the settling tank from the etching tank, and further comprising a heater configured to heat the etching solution that is delivered to the etching tank from the settling tank.

13. A wafer etching apparatus, comprising:
an advanced process control (APC) system;
an etching tank configured to contain an etching solution;
a first silicate concentration monitoring system coupled to the etching tank, configured to measure a silicate concentration in the etching solution in the etching tank;
a settling tank configured to receive the etching solution from the etching tank;
a second silicate concentration monitoring system coupled to the settling tank and the APC system, configured to detect the silicate concentration in the etching solution in the settling tank and send a detected data related to the silicate concentration in the etching solution in the settling tank to the APC system;
a seed provider comprising a rope connected to a seed crystal, wherein the APC system is configured to control the rope to move downwardly to place the seed crystal into the settling tank and to control the rope to move upwardly to pull the seed crystal out of the settling tank in response to the detected data from the second silicate concentration monitoring system; and
a connection line configured to allow the etching solution in the settling tank to flow back to the etching tank.

14. The wafer etching apparatus as claimed in claim 13, further comprising a cooler configured to cool the etching solution that is delivered to the settling tank from the etching tank.

15. The wafer etching apparatus as claimed in claim 13, wherein the etching solution comprises phosphoric acid, and the seed crystal comprises a mono-crystalline silicon seed.

16. The wafer etching apparatus as claimed in claim 13, further comprising:
a first recirculation loop comprising a first filter and a first heater, wherein the first filter is connected to the etching tank, and the first heater is connected to the first filter and the etching tank; and
a second recirculation loop comprising the settling tank, a second filter, and a second heater, wherein the second filter is connected to the settling tank, and the second heater is connected to the second filter and the etching tank.

17. The wafer etching apparatus as claimed in claim 16, wherein the second recirculation loop further comprises a cooler configured to cool the etching solution that is delivered to the settling tank from the etching tank.

18. The wafer etching apparatus as claimed in claim 11, further comprising:
a first recirculation loop including a recirculation line and a first filter, wherein both ends of the recirculation line are connected to the etching tank, and the first filter is installed in the recirculation line; and
a second recirculation loop including the settling tank, a first connection line, a second connection line, and a second filter, wherein the first connection line connects the first recirculation loop to the settling tank, the second connection line connects the settling tank to the etching tank, and the second filter is installed in the second connection line.

19. The wafer etching apparatus as claimed in claim 18, wherein the first filter and the second filter are membrane filters.

20. The wafer etching apparatus as claimed in claim 18, wherein the first connection line branches from the first recirculation loop at a point of the recirculation line, and the point is located upstream of the first filter.

* * * * *